United States Patent
Dempsey et al.

(10) Patent No.: US 11,307,259 B2
(45) Date of Patent: *Apr. 19, 2022

(54) SYSTEMS AND METHODS FOR REMOTELY DETERMINING A BATTERY CHARACTERISTIC

(71) Applicant: DURACELL U.S. OPERATIONS, INC., Wilmington, DE (US)

(72) Inventors: Nancy Taylor Dempsey, Danbury, CT (US); Karen Coltharp McGinnis, Cleveland, TN (US); Elizabeth Jane Wenzel, Wauwatosa, WI (US); Mathias Amann, Darmstadt (DE); Jordan Todorov Bourilkov, Bethany, CT (US); Sergio Coronado Hortal, Bethel, CT (US); Jonathan Livingston Joyce, Independence, KY (US); Faiz Feisal Sherman, Mason, OH (US); Steven Jeffrey Specht, Bethel, CT (US)

(73) Assignee: DURACELL U.S. OPERATIONS, INC., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/114,068

(22) Filed: Dec. 7, 2020

(65) Prior Publication Data

US 2021/0088666 A1 Mar. 25, 2021

Related U.S. Application Data

(63) Continuation of application No. 16/789,606, filed on Feb. 13, 2020, now Pat. No. 10,859,705, which is a (Continued)

(51) Int. Cl.
*G01R 31/371* (2019.01)
*G01R 31/382* (2019.01)
(Continued)

(52) U.S. Cl.
CPC ......... *G01R 31/371* (2019.01); *G01R 31/382* (2019.01); *G01S 17/89* (2013.01);
(Continued)

(58) Field of Classification Search
None
See application file for complete search history.

(56) References Cited

U.S. PATENT DOCUMENTS

| | | | |
|---|---|---|---|
| 3,354,565 | A | 11/1967 | Emmons et al. |
| 3,992,228 | A | 11/1976 | Depoix |

(Continued)

FOREIGN PATENT DOCUMENTS

| | | | |
|---|---|---|---|
| CN | 1084281 A | 3/1994 | |
| CN | 1163020 A | 10/1997 | |

(Continued)

OTHER PUBLICATIONS

Atmel Corporation, *Application Note AVR400: Low Cost A/D Converter*, available at http://www.atmel.com/images/doc0942.pfd (last visited Oct. 24, 2013).

(Continued)

*Primary Examiner* — Roy Y Yi
(74) *Attorney, Agent, or Firm* — Marshall, Gerstein & Borun LLP

(57) ABSTRACT

Included are embodiments for remotely determining a battery characteristic. Some embodiments include searching for a first wireless signal that identifies the energy storage device and, in response to receiving the first wireless signal, determining a current charge level of the energy storage device. Some embodiments include receiving a second wireless signal from the energy storage device, determining from the second wireless signal, whether the current charge level of the energy storage device reaches a predetermined threshold, and in response to determining that the current (Continued)

charge level of the energy storage device reaches the predetermined threshold, facilitating replacement of the battery.

20 Claims, 7 Drawing Sheets

Related U.S. Application Data continuation of application No. 16/572,520, filed on Sep. 16, 2019, now Pat. No. 10,684,374, which is a continuation of application No. 15/950,911, filed on Apr. 11, 2018, now Pat. No. 10,416,309, which is a continuation of application No. 15/660,565, filed on Jul. 26, 2017, now Pat. No. 9,983,312, which is a continuation of application No. 14/259,677, filed on Apr. 23, 2014, now Pat. No. 9,726,763.

(60) Provisional application No. 61/837,879, filed on Jun. 21, 2013.

(51) Int. Cl.
*H01M 10/42* (2006.01)
*H01M 10/48* (2006.01)
*G01S 17/89* (2020.01)

(52) U.S. Cl.
CPC ..... *H01M 10/425* (2013.01); *H01M 10/4221* (2013.01); *H01M 10/48* (2013.01); *H01M 10/488* (2013.01); *H01M 2010/4278* (2013.01); *H01M 2220/20* (2013.01)

(56) References Cited

U.S. PATENT DOCUMENTS

| | | |
|---|---|---|
| 3,993,985 A | 11/1976 | Chopard et al. |
| 4,117,475 A | 9/1978 | Ebihara et al. |
| 4,149,146 A | 4/1979 | Ebihara et al. |
| 4,238,554 A | 12/1980 | Barrella |
| 4,302,751 A | 11/1981 | Nakauchi et al. |
| 4,460,870 A | 7/1984 | Finger |
| 4,482,615 A | 11/1984 | Rosansky et al. |
| 4,598,243 A | 7/1986 | Kawakami |
| 4,654,280 A | 3/1987 | Bailey |
| 4,759,765 A | 7/1988 | Van Kampen |
| 4,808,497 A | 2/1989 | Blomgren et al. |
| 4,860,185 A | 8/1989 | Brewer et al. |
| 4,952,330 A | 8/1990 | Leger et al. |
| 5,015,544 A | 5/1991 | Burroughs et al. |
| 5,032,825 A | 7/1991 | Kuznicki |
| 5,188,231 A | 2/1993 | Kivell et al. |
| 5,200,686 A | 4/1993 | Lee |
| 5,219,683 A | 6/1993 | Webber |
| 5,231,356 A | 7/1993 | Parker |
| 5,250,905 A | 10/1993 | Kuo et al. |
| 5,290,414 A | 3/1994 | Marple |
| 5,339,024 A | 8/1994 | Kuo et al. |
| 5,355,089 A | 10/1994 | Treger |
| 5,366,832 A | 11/1994 | Hayashi et al. |
| 5,389,458 A | 2/1995 | Weiss et al. |
| 5,389,470 A | 2/1995 | Parker et al. |
| 5,396,177 A | 3/1995 | Kuo et al. |
| 5,418,086 A | 5/1995 | Bailey |
| 5,424,722 A | 6/1995 | Inada et al. |
| 5,438,607 A | 8/1995 | Przygoda, Jr. et al. |
| 5,458,992 A | 10/1995 | Bailey |
| 5,458,997 A | 10/1995 | Crespi et al. |
| 5,491,038 A | 2/1996 | DePalma et al. |
| 5,494,496 A | 2/1996 | Huhndorff et al. |
| 5,514,491 A | 5/1996 | Webber |
| 5,525,439 A | 6/1996 | Huhndorff et al. |
| 5,543,246 A | 8/1996 | Treger |
| 5,569,556 A | 10/1996 | Bohmer |
| 5,587,573 A | 12/1996 | Owen et al. |
| 5,596,278 A | 1/1997 | Lin |
| 5,607,790 A | 3/1997 | Hughen et al. |
| 5,627,472 A | 5/1997 | Ofer et al. |
| 5,633,592 A | 5/1997 | Lang |
| 5,640,150 A | 6/1997 | Atwater |
| 5,654,640 A | 8/1997 | Bailey |
| 5,691,083 A | 11/1997 | Bolster |
| 5,737,114 A | 4/1998 | Bailey |
| 5,786,106 A | 7/1998 | Armani |
| 5,798,933 A | 8/1998 | Nicolai |
| 5,849,046 A | 12/1998 | Bailey |
| 5,925,479 A | 7/1999 | Wei et al. |
| 5,959,568 A | 9/1999 | Woolley |
| 5,963,012 A | 10/1999 | Garcia et al. |
| 6,014,014 A | 1/2000 | Owen et al. |
| 6,084,523 A | 7/2000 | Gelnovatch et al. |
| 6,127,062 A | 10/2000 | Sargeant et al. |
| 6,143,439 A | 11/2000 | Yoppolo et al. |
| 6,156,450 A | 12/2000 | Bailey |
| 6,169,397 B1 | 1/2001 | Steinbach et al. |
| 6,171,729 B1 | 1/2001 | Gan et al. |
| 6,208,235 B1 | 3/2001 | Trontelj |
| 6,218,054 B1 | 4/2001 | Webber |
| 6,252,377 B1 | 6/2001 | Shibutani et al. |
| 6,275,161 B1 | 8/2001 | Wan et al. |
| 6,300,004 B1 | 10/2001 | Tucholski |
| 6,407,534 B1 | 6/2002 | Mukainakano |
| 6,469,471 B1 | 10/2002 | Anbuky et al. |
| 6,483,275 B1 | 11/2002 | Nebrigic et al. |
| 6,587,250 B2 | 7/2003 | Armgarth et al. |
| 6,617,069 B1 | 9/2003 | Hopper et al. |
| 6,617,072 B2 | 9/2003 | Venkatesan et al. |
| 6,627,353 B1 | 9/2003 | Munshi |
| 6,670,073 B2 | 12/2003 | Tucholski et al. |
| RE38,518 E | 5/2004 | Tucholski |
| 6,730,136 B2 | 5/2004 | Webber |
| 6,774,685 B2 | 8/2004 | O'Toole et al. |
| 6,775,562 B1 | 8/2004 | Owens et al. |
| 6,849,360 B2 | 2/2005 | Marple |
| 6,979,502 B1 | 12/2005 | Gartstein et al. |
| 6,990,171 B2 | 1/2006 | Toth et al. |
| 7,067,882 B2 | 6/2006 | Singh |
| 7,079,079 B2 | 7/2006 | Jo et al. |
| 7,157,185 B2 | 1/2007 | Marple |
| 7,386,404 B2 | 6/2008 | Cargonja et al. |
| 7,474,230 B2 | 1/2009 | Blom et al. |
| 7,489,431 B2 | 2/2009 | Malmstrom et al. |
| 7,511,454 B1 | 3/2009 | Legg |
| 7,561,050 B2 | 7/2009 | Bhogal et al. |
| 7,576,517 B1 | 8/2009 | Cotton et al. |
| 7,586,416 B2 | 9/2009 | Ariyoshi et al. |
| 7,598,880 B2 | 10/2009 | Powell et al. |
| 7,606,530 B1 | 10/2009 | Anderson et al. |
| 7,715,884 B2 | 5/2010 | Book et al. |
| 7,741,970 B2 | 6/2010 | Cunningham et al. |
| 7,745,046 B2 | 6/2010 | Kim et al. |
| 7,768,236 B2 | 8/2010 | Takamura et al. |
| 7,772,850 B2 | 8/2010 | Bertness |
| 7,805,263 B2 | 9/2010 | Mack |
| 7,911,182 B2 | 3/2011 | Cargonja et al. |
| 7,944,368 B2 | 5/2011 | Carter et al. |
| 8,031,054 B2 | 10/2011 | Tuttle |
| 8,106,845 B2 | 1/2012 | Savry |
| 8,119,286 B2 | 2/2012 | Issaev et al. |
| 8,131,486 B2 | 3/2012 | Leonard et al. |
| 8,344,685 B2 | 1/2013 | Bertness et al. |
| 8,368,356 B2 | 2/2013 | Nakashima et al. |
| 8,374,507 B2 | 2/2013 | Hudson et al. |
| 8,424,092 B2 | 4/2013 | Ikeuchi et al. |
| 8,427,109 B2 | 4/2013 | Melichar |
| 8,471,888 B2 | 6/2013 | George et al. |
| 8,652,670 B2 | 2/2014 | Uchida |
| 8,653,926 B2 | 2/2014 | Detcheverry et al. |
| 8,900,731 B2 | 12/2014 | Bohne |
| 8,905,317 B1 | 12/2014 | Hsu et al. |
| 9,037,426 B2 | 5/2015 | Schaefer |
| 9,060,213 B2 | 6/2015 | Jones |
| 9,076,092 B2 | 7/2015 | Ritamaki et al. |
| 9,083,063 B2 | 7/2015 | Specht et al. |

(56) References Cited

U.S. PATENT DOCUMENTS

| | | |
|---|---|---|
| 9,146,595 B2 | 9/2015 | Forutanpour et al. |
| 9,167,317 B2 | 10/2015 | DeMar |
| 9,189,667 B2 | 11/2015 | Bourilkov et al. |
| 9,235,044 B2 | 1/2016 | Specht et al. |
| 9,297,859 B2 | 3/2016 | Mukaitani et al. |
| 9,312,575 B2 | 4/2016 | Stukenberg et al. |
| 9,331,378 B2 | 5/2016 | Merlin et al. |
| 9,425,487 B2 | 8/2016 | Bertness |
| 9,453,885 B2 | 9/2016 | Mukaitani et al. |
| 9,459,323 B2 | 10/2016 | Mukaitani et al. |
| 9,461,339 B2 | 10/2016 | Roohparvar |
| 9,478,850 B2 | 10/2016 | Bourilkov et al. |
| 9,551,758 B2 | 1/2017 | Bourilkov et al. |
| 9,568,556 B2 | 2/2017 | Bourilkov et al. |
| 9,619,612 B2 | 4/2017 | Kallfelz et al. |
| 9,639,724 B2 | 5/2017 | Bourilkov et al. |
| 9,661,576 B2 | 5/2017 | Tomisawa |
| 9,699,818 B2 | 7/2017 | Grothaus et al. |
| 9,726,763 B2 | 8/2017 | Dempsey et al. |
| 9,739,837 B2 | 8/2017 | Bourilkov et al. |
| 9,746,524 B2 | 8/2017 | Petrucelli |
| 9,774,210 B1 | 9/2017 | Wright |
| 9,823,310 B2 | 11/2017 | Bourilkov et al. |
| 9,841,462 B2 | 12/2017 | Kim et al. |
| 9,843,220 B2 | 12/2017 | Herrmann et al. |
| 9,869,726 B2 | 1/2018 | Zumstein et al. |
| 9,882,250 B2 | 1/2018 | Chappelle et al. |
| 9,887,463 B2 | 2/2018 | Bourilkov et al. |
| 9,893,390 B2 | 2/2018 | Specht et al. |
| 9,983,312 B2 | 5/2018 | Dempsey et al. |
| 10,094,886 B2 | 10/2018 | Bourilkov et al. |
| 10,151,802 B2 | 12/2018 | Riemer et al. |
| 10,184,988 B2 | 1/2019 | Bourilkov et al. |
| 10,297,875 B2 | 5/2019 | Riemer et al. |
| 10,416,309 B2 | 9/2019 | Dempsey et al. |
| 10,483,634 B2 | 11/2019 | Bourilkov et al. |
| 10,859,705 B2 | 12/2020 | Dempsey et al. |
| 2001/0005123 A1 | 6/2001 | Jones et al. |
| 2001/0026226 A1 | 10/2001 | Andersson et al. |
| 2002/0001745 A1 | 1/2002 | Gartstein et al. |
| 2002/0086718 A1 | 7/2002 | Bigwood et al. |
| 2003/0070283 A1 | 4/2003 | Webber |
| 2003/0169047 A1 | 9/2003 | Chen |
| 2003/0170537 A1 | 9/2003 | Randell |
| 2003/0184493 A1 | 10/2003 | Robinet et al. |
| 2003/0228518 A1 | 12/2003 | Marple |
| 2004/0029007 A1 | 2/2004 | Kusumoto et al. |
| 2004/0048512 A1 | 3/2004 | Chen |
| 2004/0183742 A1 | 9/2004 | Goff et al. |
| 2005/0038614 A1 | 2/2005 | Botts et al. |
| 2005/0073282 A1 | 4/2005 | Carrier et al. |
| 2005/0095508 A1 | 5/2005 | Yamamoto |
| 2005/0112462 A1 | 5/2005 | Marple |
| 2005/0162129 A1 | 7/2005 | Mutabdzija et al. |
| 2005/0233214 A1 | 10/2005 | Marple et al. |
| 2005/0258797 A1 | 11/2005 | Hung |
| 2005/0277023 A1 | 12/2005 | Marple et al. |
| 2006/0017581 A1 | 1/2006 | Schwendinger et al. |
| 2006/0028179 A1 | 2/2006 | Yudahira et al. |
| 2006/0043933 A1 | 3/2006 | Latinis |
| 2006/0046152 A1 | 3/2006 | Webber |
| 2006/0046153 A1 | 3/2006 | Webber |
| 2006/0046154 A1 | 3/2006 | Webber et al. |
| 2006/0047576 A1 | 3/2006 | Aaltonen et al. |
| 2006/0163692 A1 | 7/2006 | Detecheverry et al. |
| 2006/0168802 A1 | 8/2006 | Tuttle |
| 2006/0170397 A1 | 8/2006 | Srinivasan et al. |
| 2006/0208898 A1 | 9/2006 | Swanson et al. |
| 2006/0247156 A1 | 11/2006 | Vanderby et al. |
| 2006/0261960 A1 | 11/2006 | Haraguchi et al. |
| 2007/0080804 A1 | 4/2007 | Hirahara et al. |
| 2007/0096697 A1 | 5/2007 | Maireanu |
| 2007/0108946 A1 | 5/2007 | Yamauchi et al. |
| 2007/0182576 A1 | 8/2007 | Proska et al. |
| 2007/0210924 A1 | 9/2007 | Arnold et al. |
| 2007/0273329 A1 | 11/2007 | Kobuse et al. |
| 2008/0053716 A1 | 3/2008 | Scheucher |
| 2008/0076029 A1 | 3/2008 | Bowden et al. |
| 2008/0079391 A1 | 4/2008 | Schroeck et al. |
| 2008/0157924 A1 | 7/2008 | Batra |
| 2008/0160392 A1 | 7/2008 | Toya et al. |
| 2008/0206627 A1 | 8/2008 | Wright |
| 2008/0218351 A1 | 9/2008 | Corrado et al. |
| 2008/0252462 A1 | 10/2008 | Sakama |
| 2009/0008031 A1 | 1/2009 | Gould et al. |
| 2009/0009177 A1 | 1/2009 | Kim et al. |
| 2009/0024309 A1 | 1/2009 | Crucs |
| 2009/0041228 A1 | 2/2009 | Owens et al. |
| 2009/0098462 A1 | 4/2009 | Fujiwara et al. |
| 2009/0148756 A1 | 6/2009 | Specht et al. |
| 2009/0155673 A1 | 6/2009 | Northcott |
| 2009/0179763 A1 | 7/2009 | Sheng |
| 2009/0214950 A1 | 8/2009 | Bowden et al. |
| 2009/0263727 A1 | 10/2009 | Josephs et al. |
| 2009/0273473 A1 | 11/2009 | Tuttle |
| 2009/0289825 A1 | 11/2009 | Trinkle |
| 2009/0297949 A1 | 12/2009 | Berkowitz et al. |
| 2009/0308936 A1 | 12/2009 | Nitzan et al. |
| 2010/0019733 A1 | 1/2010 | Rubio |
| 2010/0030592 A1 | 2/2010 | Evans et al. |
| 2010/0073003 A1 | 3/2010 | Sakurai et al. |
| 2010/0081049 A1 | 4/2010 | Holl et al. |
| 2010/0085008 A1 | 4/2010 | Suzuki et al. |
| 2010/0087241 A1 | 4/2010 | Nguyen et al. |
| 2010/0143753 A1 | 6/2010 | Kim et al. |
| 2010/0209744 A1 | 8/2010 | Kim |
| 2010/0219252 A1 | 9/2010 | Kikuchi et al. |
| 2010/0295943 A1 | 11/2010 | Cha et al. |
| 2010/0308974 A1 | 12/2010 | Rowland et al. |
| 2011/0018777 A1 | 1/2011 | Brown |
| 2011/0023130 A1 | 1/2011 | Gudgel et al. |
| 2011/0104520 A1 | 5/2011 | Ahn |
| 2011/0123874 A1 | 5/2011 | Issaev et al. |
| 2011/0163752 A1 | 7/2011 | Janousek et al. |
| 2011/0293969 A1 | 12/2011 | Hoofman et al. |
| 2012/0021266 A1 | 1/2012 | Marple et al. |
| 2012/0056002 A1 | 3/2012 | Ritamaki et al. |
| 2012/0081774 A1 | 4/2012 | De Paiva Martins et al. |
| 2012/0086615 A1 | 4/2012 | Norair |
| 2012/0121943 A1 | 5/2012 | Roohparvar |
| 2012/0183862 A1 | 7/2012 | Gupta et al. |
| 2012/0190305 A1 | 7/2012 | Wuidart |
| 2012/0206102 A1 | 8/2012 | Okamura et al. |
| 2012/0206302 A1 | 8/2012 | Ramachandran et al. |
| 2012/0217971 A1 | 8/2012 | Deluca |
| 2012/0235870 A1 | 9/2012 | Forster |
| 2012/0277832 A1 | 11/2012 | Hussain |
| 2012/0299597 A1 | 11/2012 | Shigemizu |
| 2012/0323511 A1 | 12/2012 | Saigo et al. |
| 2013/0069768 A1 | 3/2013 | Madhyastha et al. |
| 2013/0117595 A1 | 5/2013 | Murawski et al. |
| 2013/0127611 A1 | 5/2013 | Bernstein et al. |
| 2013/0148283 A1 | 6/2013 | Forutanpour et al. |
| 2013/0154652 A1 | 6/2013 | Rice et al. |
| 2013/0161380 A1 | 6/2013 | Joyce et al. |
| 2013/0162402 A1 | 6/2013 | Amann et al. |
| 2013/0162403 A1 | 6/2013 | Striemer et al. |
| 2013/0162404 A1 | 6/2013 | Striemer et al. |
| 2013/0164567 A1 | 6/2013 | Olsson et al. |
| 2013/0171479 A1 | 7/2013 | Kim et al. |
| 2013/0183568 A1 | 7/2013 | Babinec et al. |
| 2013/0185008 A1 | 7/2013 | Itabashi et al. |
| 2013/0271072 A1 | 10/2013 | Lee et al. |
| 2013/0295421 A1 | 11/2013 | Teramoto et al. |
| 2013/0320989 A1 | 12/2013 | Inoue et al. |
| 2014/0062663 A1 | 3/2014 | Bourilkov et al. |
| 2014/0139380 A1 | 5/2014 | Ouyang et al. |
| 2014/0188413 A1 | 7/2014 | Bourilkov et al. |
| 2014/0197802 A1 | 7/2014 | Yamazaki |
| 2014/0229129 A1 | 8/2014 | Campbell et al. |
| 2014/0302348 A1 | 10/2014 | Specht et al. |
| 2014/0302351 A1 | 10/2014 | Specht et al. |
| 2014/0320144 A1 | 10/2014 | Nakaya |
| 2014/0342193 A1 | 11/2014 | Mull et al. |

(56) References Cited

U.S. PATENT DOCUMENTS

| | | |
|---|---|---|
| 2014/0346873 A1 | 11/2014 | Colangelo et al. |
| 2014/0347249 A1 | 11/2014 | Bourilkov et al. |
| 2014/0370344 A1 | 12/2014 | Lovelace et al. |
| 2014/0379285 A1 | 12/2014 | Dempsey et al. |
| 2015/0061603 A1 | 3/2015 | Loftus et al. |
| 2015/0064524 A1 | 3/2015 | Noh et al. |
| 2015/0162649 A1 | 6/2015 | Bae et al. |
| 2015/0349391 A1 | 12/2015 | Chappelle et al. |
| 2015/0357685 A1 | 12/2015 | Iwasawa et al. |
| 2016/0034733 A1 | 2/2016 | Bourilkov et al. |
| 2016/0049695 A1 | 2/2016 | Lim et al. |
| 2016/0064781 A1 | 3/2016 | Specht et al. |
| 2016/0092847 A1 | 3/2016 | Buchbinder |
| 2016/0137088 A1 | 5/2016 | Lim et al. |
| 2016/0154025 A1 | 6/2016 | Song et al. |
| 2016/0277879 A1 | 9/2016 | Daoura et al. |
| 2017/0040698 A1 | 2/2017 | Bourilkov et al. |
| 2017/0062841 A1 | 3/2017 | Riemer et al. |
| 2017/0062880 A1 | 3/2017 | Riemer et al. |
| 2017/0092994 A1 | 3/2017 | Canfield et al. |
| 2017/0125855 A1 | 5/2017 | Gong et al. |
| 2017/0176539 A1 | 6/2017 | Younger |
| 2017/0286918 A1 | 10/2017 | Westermann et al. |
| 2017/0301961 A1 | 10/2017 | Kim et al. |
| 2017/0315183 A1 | 11/2017 | Chao et al. |
| 2017/0331162 A1 | 11/2017 | Clarke et al. |
| 2018/0040929 A1 | 2/2018 | Chappelle et al. |
| 2018/0088182 A1 | 3/2018 | Bourilkov et al. |
| 2018/0120386 A1 | 5/2018 | Riemer et al. |
| 2018/0123174 A1 | 5/2018 | Riemer et al. |
| 2018/0123175 A1 | 5/2018 | Riemer et al. |
| 2018/0123176 A1 | 5/2018 | Riemer et al. |
| 2018/0123233 A1 | 5/2018 | Bourilkov et al. |
| 2018/0159225 A1 | 6/2018 | Bourilkov et al. |
| 2019/0113579 A1 | 4/2019 | Riemer et al. |
| 2019/0137572 A1 | 5/2019 | Bourilkov et al. |
| 2020/0011997 A1 | 1/2020 | Dempsey et al. |

FOREIGN PATENT DOCUMENTS

| | | |
|---|---|---|
| CN | 1228540 A | 9/1999 |
| CN | 1315072 A | 9/2001 |
| CN | 1529182 A | 9/2004 |
| CN | 2828963 Y | 10/2006 |
| CN | 101126795 A | 2/2008 |
| CN | 201142022 Y | 10/2008 |
| CN | 201233435 Y | 5/2009 |
| CN | 101702792 A | 5/2010 |
| CN | 101785164 A | 7/2010 |
| CN | 102097844 A | 6/2011 |
| CN | 102142186 A | 8/2011 |
| CN | 102544709 A | 7/2012 |
| CN | 202308203 U | 7/2012 |
| CN | 202720320 U | 2/2013 |
| CN | 202856390 U | 4/2013 |
| CN | 103682482 A | 3/2014 |
| CN | 104635169 A | 5/2015 |
| CN | 105337367 A | 2/2016 |
| CN | 205160145 U | 4/2016 |
| CN | 106405241 A | 2/2017 |
| CN | 106848448 A | 6/2017 |
| CN | 107284272 A | 10/2017 |
| CN | 206804833 U | 12/2017 |
| DE | 10118027 A1 | 11/2002 |
| DE | 10118051 A1 | 11/2002 |
| EP | 0523901 A1 | 1/1993 |
| EP | 1450174 A1 | 8/2004 |
| EP | 1693807 A1 | 8/2006 |
| EP | 1786057 A2 | 5/2007 |
| EP | 1821363 A1 | 8/2007 |
| EP | 2065962 A1 | 6/2009 |
| EP | 2204873 A1 | 7/2010 |
| EP | 2324535 A1 | 5/2011 |
| EP | 2328223 A1 | 6/2011 |
| EP | 2645447 A1 | 10/2013 |
| EP | 2680093 A2 | 1/2014 |
| EP | 2790262 A1 | 10/2014 |
| EP | 3128599 A1 | 2/2017 |
| JP | S52005581 A | 1/1977 |
| JP | 61169781 | 7/1986 |
| JP | 02142324 | 5/1990 |
| JP | H03131771 A | 6/1991 |
| JP | H06284170 A | 10/1994 |
| JP | H09005366 A | 1/1997 |
| JP | 10014003 | 1/1998 |
| JP | 2000077928 A | 3/2000 |
| JP | 2001022905 A | 1/2001 |
| JP | 2004085580 A | 3/2004 |
| JP | 2004-253858 A | 9/2004 |
| JP | 2004534430 A | 11/2004 |
| JP | 2005327099 A | 11/2005 |
| JP | 2006139544 A | 6/2006 |
| JP | 2006284431 A | 10/2006 |
| JP | 2006324074 A | 11/2006 |
| JP | 2007515848 A | 6/2007 |
| JP | 2007171045 A | 7/2007 |
| JP | 2008042985 A | 2/2008 |
| JP | 2008-530682 A | 8/2008 |
| JP | 2008181855 A | 8/2008 |
| JP | 2009-37374 | 2/2009 |
| JP | 2010098361 A | 4/2010 |
| JP | 2010-154012 A | 7/2010 |
| JP | 2011113759 A | 6/2011 |
| JP | 2011203595 A | 10/2011 |
| JP | 20120056002 A | 3/2012 |
| JP | 2012085491 A | 4/2012 |
| JP | 2012-129183 A | 7/2012 |
| JP | 2012161614 A | 8/2012 |
| JP | 2012170262 A | 9/2012 |
| JP | 2013-038967 A | 2/2013 |
| JP | 2013038961 A | 2/2013 |
| JP | 2013120640 A | 6/2013 |
| KR | 2011-0018488 A | 2/2011 |
| TW | M510009 U | 10/2015 |
| TW | I580153 B | 4/2017 |
| WO | WO-95/01062 A1 | 1/1995 |
| WO | WO-03/047064 A2 | 6/2003 |
| WO | WO-2004/047215 A1 | 6/2004 |
| WO | WO-2004/107251 A2 | 12/2004 |
| WO | WO-2005/078673 A1 | 8/2005 |
| WO | WO-2006/048838 A1 | 5/2006 |
| WO | WO-2006/085291 A2 | 8/2006 |
| WO | WO-2008/151181 A1 | 12/2008 |
| WO | WO-2008/156735 A1 | 12/2008 |
| WO | WO-2010/127509 A1 | 11/2010 |
| WO | WO-2011/063679 A1 | 6/2011 |
| WO | WO-2011/096863 A1 | 8/2011 |
| WO | WO-2012/051272 A2 | 4/2012 |
| WO | WO-2012/061262 A1 | 5/2012 |
| WO | WO-2012/070635 A1 | 5/2012 |
| WO | WO-2012/083759 A1 | 6/2012 |
| WO | WO-2013/022857 A2 | 2/2013 |
| WO | WO-2013/024341 A1 | 2/2013 |
| WO | WO-2013/069423 A1 | 5/2013 |
| WO | WO-2013/084481 A1 | 6/2013 |
| WO | WO-2013/101652 A1 | 7/2013 |
| WO | WO-2015/183609 A1 | 12/2015 |
| WO | WO-2016/146006 A1 | 9/2016 |
| WO | WO-2016/166735 A1 | 10/2016 |
| WO | WO-2016/172542 A1 | 10/2016 |

OTHER PUBLICATIONS

Chinese patent application No. 201480034145.1, Notification of First Office Action (with English translation), dated May 4, 2017.

Chinese Patent Application No. 201480034145.1, Notification of the Second Office Action, dated Jan. 19, 2018.

European Patent Application No. 14813210.3, Communication Pursuant to Article 94(3) EPC, dated Sep. 17, 2020.

European Patent Application No. 14813210.3, Summons to Attend Oral Proceedings Pursuant to Rule 115(1) EPC, dated Feb. 11, 2020.

European patent application No. EP 14813210, Supplementary European Search Report, dated Nov. 25, 2016.

(56) References Cited

OTHER PUBLICATIONS

Japanese patent application No. 2016-521535, Notice of Rejection, dated Nov. 15, 2016.
Kooser, Tethercell magically turns AA batteries into Bluetooth devices, CNET.com, downloaded from the Internet at: <https://www.cnet.com/news/tethercell-magically-turns-aa-batteries-into-bluetooth-devices/> (Jan. 8, 2013).
PCT International Search report with Written Opinion in corresponding International application PCT/US2014/042898 dated Nov. 7, 2014.
Tethercell Smart Battery Adapter fundraising campaign on Indiegogo website (<https://www.indiegogo.com/projects/tethercell-smart-battery-adapter#/>) (launched Oct. 2013).
Tethercell video uploaded at <https://vimeo.com/53823785> (Oct. 2012).
Yamashiro, Voltage Detecting Circuit, Japanese Patent No. 52005581, Hitashi Ltd., (Jan. 17, 1977), Translated by the United States Patent and Trademark Office via Phoenix Translations (Elgin, TX) in Feb. 2018.

SYSTEMS AND METHODS FOR REMOTELY DETERMINING A BATTERY CHARACTERISTIC

CROSS REFERENCE TO RELATED APPLICATIONS

This application is a continuation of U.S. Ser. No. 16/789,606 filed Feb. 13, 2020, which is a continuation of U.S. Ser. No. 16/572,520 filed Sep. 16, 2019, which is a continuation of U.S. Ser. No. 15/950,911 filed Apr. 11, 2018, which is a continuation of U.S. Ser. No. 15/660,565 filed Jul. 26, 2017, which is a continuation of U.S. Ser. No. 14/259,677, filed Apr. 23, 2014, which claims priority to U.S. Ser. No. 61/837,879, filed Jun. 21, 2013, the entire disclosures of each of which are incorporated herein by reference.

FIELD OF THE INVENTION

The present application relates generally to systems and methods for remotely determining a battery characteristic and specifically to utilize wireless communications to determine charge level and/or health of a battery or other energy storage device.

BACKGROUND OF THE INVENTION

Many electric devices rely on battery power to provide a greater level of mobility and freedom from power chords. While battery-operated devices are becoming more desired, oftentimes a battery charge may deplete during use, thereby limiting the effectiveness of the device. This can create inconveniences due to the unexpected nature of the battery failure and the uncertainty of locating replacement batteries. As a consequence, many battery-powered devices become less convenient in these respects, due to these and other limitations.

SUMMARY OF THE INVENTION

Included are embodiments for remotely determining a battery characteristic. Some embodiments include searching for a first wireless signal that identifies the energy storage device and, in response to receiving the first wireless signal, determining a current charge level of the energy storage device. Some embodiments include receiving a second wireless signal from the energy storage device, determining from the second wireless signal, whether the current charge level of the energy storage device reaches a predetermined threshold, and in response to determining that the current charge level of the energy storage device reaches the predetermined threshold, sending, by the computing device, an alert indicating the current charge level.

Also included are embodiments of a computing device. Some embodiments of the computing device include a processor and a memory component. The memory component may store logic that, when executed by the processor, causes the computing device to detect a wireless communication signal from a battery, determine, from the wireless communication signal, a battery characteristic of the battery, and provide a first user interface that includes data related to the battery characteristic of the battery.

Also included are embodiments of a non-transitory computer-readable medium. Some embodiments of the non-transitory computer-readable medium include logic that, when executed by a computing device, causes the computing device to determine whether an unused or partially used energy storage device is available and within a predetermined range. In response to determining that the unused or partially used energy storage device is available and within the predetermined range, the logic may cause the computing device to determine whether the unused or partially used energy storage device is compatible with a device that the energy storage device currently powers, and in response to determining that the unused or partially used energy storage device is compatible with the device that the energy storage device currently powers, provide a second user interface that includes a physical location of the energy storage device. In some embodiments, in response to determining that no unused energy storage devices are available and within the predetermined range, the logic causes the computing device to facilitate an online purchase of a replacement energy storage device.

BRIEF DESCRIPTION OF THE DRAWINGS

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate various embodiments described herein, and together with the description serve to explain the principles and operations of the claimed subject matter.

DETAILED DESCRIPTION OF THE INVENTION

Embodiments disclosed herein include systems and methods for remotely determining a battery characteristic. Specifically, embodiments disclosed herein include a user computing device, such as a mobile telephone, tablet computer, a near field communication (NFC) reader, etc., that is configured for wirelessly receiving a wireless communication signal from a powered device, a battery, and/or other energy storage device (broadly referred to herein as a "battery"). The user computing device may be incorporated within a device, such as a television, an automobile, etc. The battery may include a radio frequency identifier (RFID) tag, wireless fidelity (Wi-Fi) transmitter, Bluetooth transmitter, a barcode, and/or other wireless communicator for communicating with the computing device. The user computing device may exchange data with the battery (and/or device that the battery currently powers) for monitoring a characteristic of the battery, such as a current impedance level, a current charge level, a current depletion rate, etc.

Similarly, some embodiments may be configured such that the user computing device communicates with the powered device that is powered by the battery. In such embodiments, the powered device may then communicate with the battery and/or may include testing hardware for determining the characteristic of the battery. The powered device may communicate information about the usage frequency of the device or other information about the powered device. The user computing device may provide the user with usage suggestions as a result of the information communicated to the user computing device from the powered device. Other embodiments are also within the scope of this disclosure and are described in detail, below.

Figure 1:
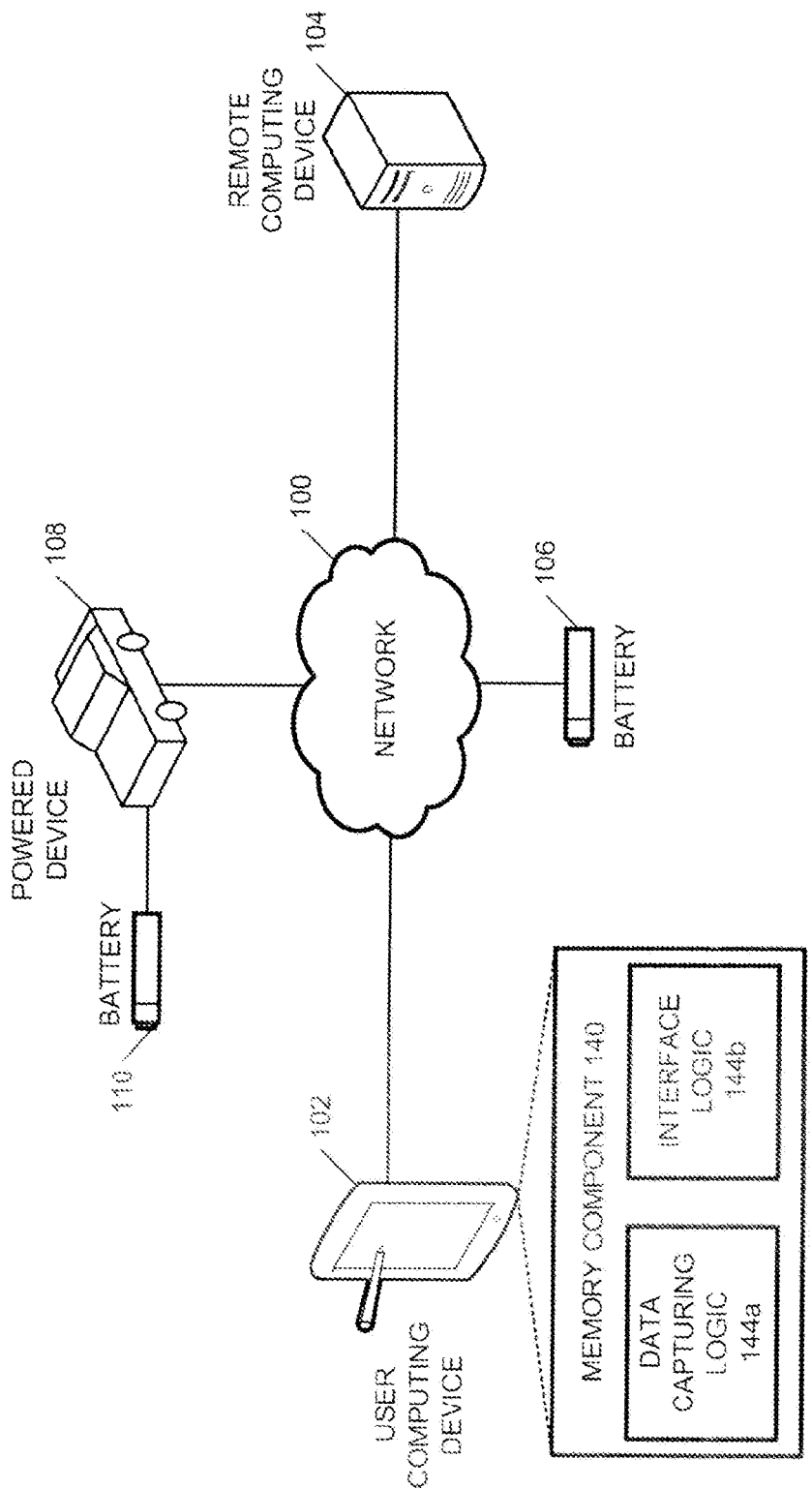
FIG. 1 depicts a computing environment for remotely determining a battery characteristic, according to embodiments disclosed herein.

Referring now to the drawings, FIG. 1 depicts a computing environment for remotely determining a battery characteristic, according to embodiments disclosed herein. As illustrated, a network 100 may be coupled to a user computing device 102, a remote computing device 104, a battery 106, and/or a powered device 108. As also shown, the powered device 108 may be coupled with a different battery 110. The network 100 may include any wide area and/or local area network, such as the internet, a mobile communications network, a satellite network, a public service telephone network (PSTN) and/or other network for facilitating communication between devices. If the network 100 includes a local area network, the local area network may be configured as a communication path via Wi-Fi, Bluetooth, RFID, and/or other wireless protocol.

Accordingly, the user computing device 102 may include a personal computer, laptop computer, tablet, mobile communications device, database, and/or other computing device that is accessible by a user. The user computing device 102 may additionally include a memory component 140, which stores data capturing logic 144a and interface logic 144b, described in more detail below.

The remote computing device 104 is also coupled to the network 100 and may be configured as an online retailer for purchasing additional batteries, as an information server for accessing data regarding the battery 106, a data collection server for monitoring battery usage and useful life, etc., as described in more detail, below. As an example, the user computing device 102 may recognize that a charge level of a disposable battery or a health of a rechargeable battery that indicates an expected time that the battery should be replaced. As described in more detail below, the user computing device 102 may communicate with the remote computing device 104 to order replacement batteries (or other replacement energy storage device).

Similarly, a battery manufacturer may monitor use of battery life and usage for designing new batteries. In addition, or alternatively, the battery manufacturer may monitor manufacturing and quality-related data of the battery, such as via the remote computing device 104. In such embodiments, the remote computing device 104 may function as a server for collecting and analyzing such data. In some embodiments, the remote computing device 104 may provide a user account for a battery purchaser to monitor battery usage from any computing device with access to the network 100.

Also depicted in FIG. 1 is a battery 106. The battery 106 may take the form of any energy storage device, such as a chemical battery (such as an alkaline primary battery, a lithium primary battery, a nickel-metal hydride rechargeable battery, a lithium ion rechargeable battery, etc.), a dry cell, wet cell, capacitor, and/or others. Regardless of the type of energy storage device, the battery 106 may be configured with one or more sensors for determining a battery characteristic (or a plurality of battery characteristics). The battery characteristics may include a current charge level; a depletion rate; an impedance; an open-circuit voltage (OCV); a closed-circuit voltage; a discharge rate; discharge/charge cycles; cycle life; a battery type, such as primary or secondary; a battery size, such as AAA, AA, C, or D; an end of battery life; battery manufacturing/quality-related data, such as manufacturing date, material lot number, cell assembly line number, active material weights, electrolyte weights, and any other manufacturing-related information; etc. Additionally, the battery 106 may include a wireless transmitter, such as an RFID tag, Bluetooth transmitter, Wi-Fi transmitter, etc. for sending data to the user computing device 102 and/or the remote computing device 104. The wireless transmitter may be installed with the battery during manufacturing and/or applied after the battery is manufactured. The data may include the battery characteristics, a battery identifier, a powered device identifier, location information, a physical location, and/or other information.

While the battery 106 is depicted as not powering a powered device, this is merely an example. As discussed in more detail below, the user computing device 102 and/or the remote computing device 104 may be configured to communicate with batteries that are powering devices, unused, and/or partially used, but not currently powering a powered device. As such, the battery 106 may or may not be currently powering a powered device. Similarly, the battery 106 may or may not be currently charged by a battery charging device.

Additionally depicted in FIG. 1 is a powered device 108 that communicates with the user computing device 102 and/or the remote computing device 104. Specifically, while some embodiments disclosed herein may include a battery 106 that is configured for sending wireless signals to the user computing device 102 and/or the remote computing device 104, this is merely an example. Specifically, the battery 110 may power the powered device 108 and thus may be electrically coupled with the powered device 108. Accordingly, the powered device 108 may be configured to communicate information with the battery 110, such that in response to the powered device 108 receiving a battery characteristic and/or other data, the powered device 108 may communicate with the user computing device 102 and/or the remote computing device 104, as described above. Such an embodiment accommodates situations where the battery 110 does not include a wireless transmitter. Similarly, some embodiments may be configured such that the powered device 108 includes one or more sensors for determining the battery characteristic, as well as logic for determining a battery identifier.

It should also be understood that while the user computing device 102 and the remote computing device 104 are each depicted as individual devices, these are merely examples. Either of these devices may include one or more personal computers, servers, laptops, tablets, mobile computing devices, data storage devices, mobile phones, etc. that are configured for providing the functionality described herein. It should additionally be understood that other computing devices may also be included in the embodiment of FIG. 1.

Similarly, while single batteries 106 and 110, as well as a single powered device 108 are depicted in FIG. 1, this is also merely an example. As is understood, a plurality of batteries (or a plurality of energy storage devices) may power a device, such as powered device 108. Accordingly, the user computing device 102 and/or the remote computing device 104 may be configured to communicate with a plurality of different batteries, powering a plurality of different devices, and/or not currently associated with a device.

Figure 2:
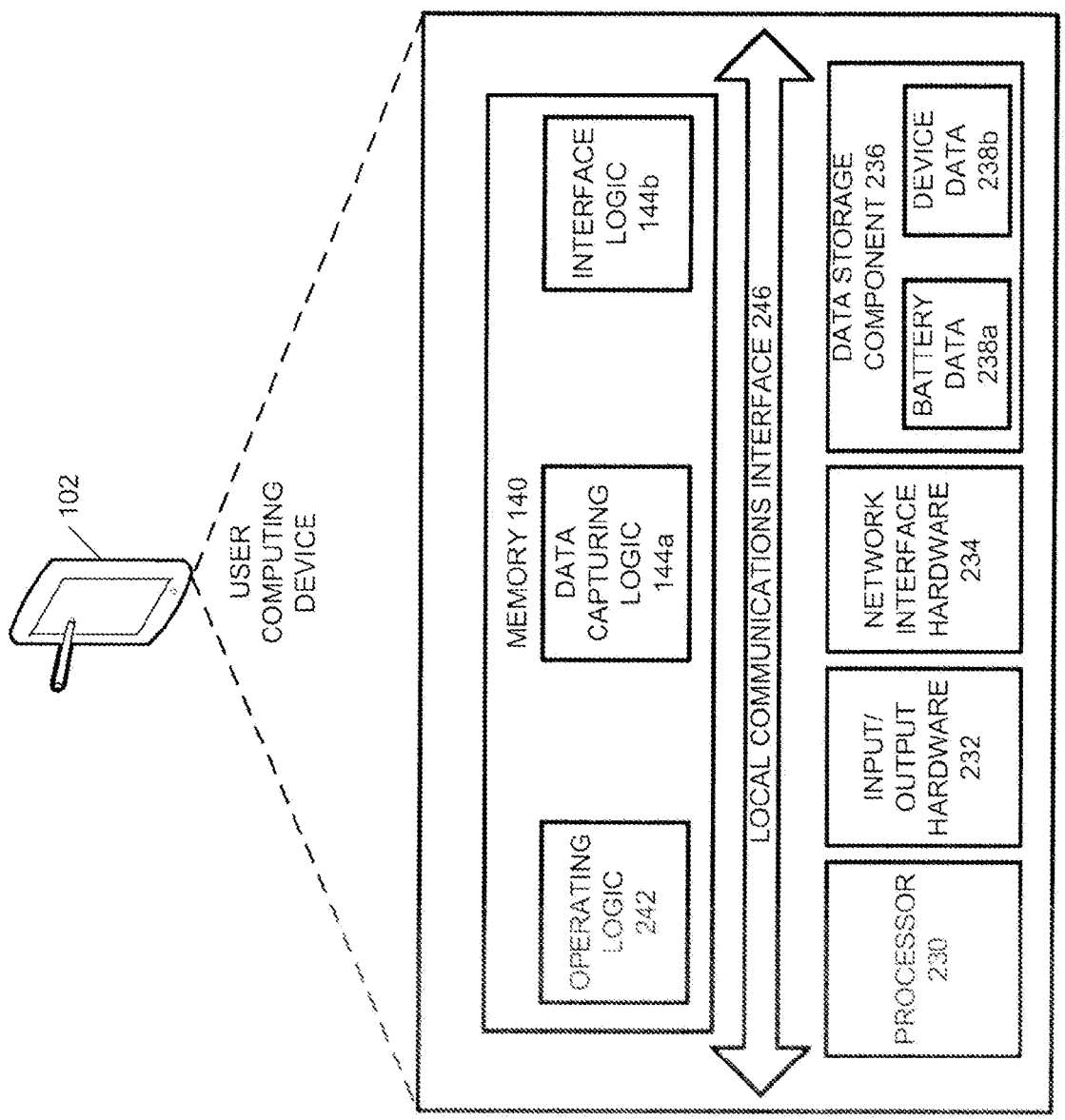
FIG. 2 depicts a user computing device that may be utilized for remotely determining a battery characteristic, according to embodiments disclosed herein.

FIG. 2 depicts a user computing device 102 that may be utilized for remotely determining a battery characteristic, according to embodiments disclosed herein. In the illustrated embodiment, the user computing device 102 includes a processor 230, input/output hardware 232, network interface hardware 234, a data storage component 236 (which stores battery data 238*a* and device data 238*b*), and the memory component 140. The memory component 140 includes hardware and may be configured as volatile and/or nonvolatile memory and, as such, may include random access memory (including SRAM, DRAM, and/or other types of RAM), flash memory, registers, compact discs (CD), digital versatile discs (DVD), and/or other types of non-transitory computer-readable mediums. Depending on the particular embodiment, the non-transitory computer-readable medium may reside within the user computing device 102 and/or external to the user computing device 102.

Additionally, the memory component 140 may be configured to store operating logic 242, the data capturing logic 144*a*, and the interface logic 144*b*, each of which may be embodied as a computer program, firmware, and/or hardware, as an example. A local communications interface 246 is also included in FIG. 2 and may be implemented as a bus or other interface to facilitate communication among the components of the user computing device 102.

The processor 230 may include any hardware processing component operable to receive and execute instructions (such as from the data storage component 236 and/or memory component 140). The input/output hardware 232 may include and/or be configured to interface with a monitor, keyboard, mouse, printer, camera, microphone, speaker, and/or other device for receiving, sending, and/or presenting data. The network interface hardware 234 may include and/or be configured for communicating with any wired or wireless networking hardware, a satellite, an antenna, a modem, LAN port, wireless fidelity (Wi-Fi) card, RFID receiver, Bluetooth receiver, image recognizer (for recognizing a battery and/or other data related to the battery in place of the other wireless data communication mediums), bar code reader, WiMax card, mobile communications hardware, and/or other hardware for communicating with other networks and/or devices. From this connection, communication may be facilitated between the user computing device 102, the battery 106, the powered device 108, the remote computing device 104, and/or other computing devices. It should be understood that the data storage component 236 may reside local to and/or remote from the user computing device 102 and may be configured to store one or more pieces of data for access by the user computing device 102 and/or other components. In some embodiments, the data storage component 236 may be located remotely from the user computing device 102 and thus accessible via the network 100. In some embodiments however, the data storage component 236 may merely be a peripheral device, but external to the user computing device 102.

Included in the memory component 140 are the operating logic 242, the data capturing logic 144*a*, and the interface logic 144*b*. The operating logic 242 may include an operating system and/or other software for managing components of the user computing device 102. Similarly, the data capturing logic 144*a* may be configured to cause the user computing device 102 to detect and receive communications from the battery 106 and/or the powered device 108. The interface logic 144*b* may cause the user computing device 102 to make determinations from the received data, as well as provide user interfaces, communicate with the remote computing device 104, and/or perform other operations, as discussed below.

It should be understood that the components illustrated in FIG. 2 are merely exemplary and are not intended to limit the scope of this disclosure. While the components in FIG. 2 are illustrated as residing within the user computing device 102, this is merely an example. In some embodiments, one or more of the components may reside external to the user computing device 102.

Figure 3:
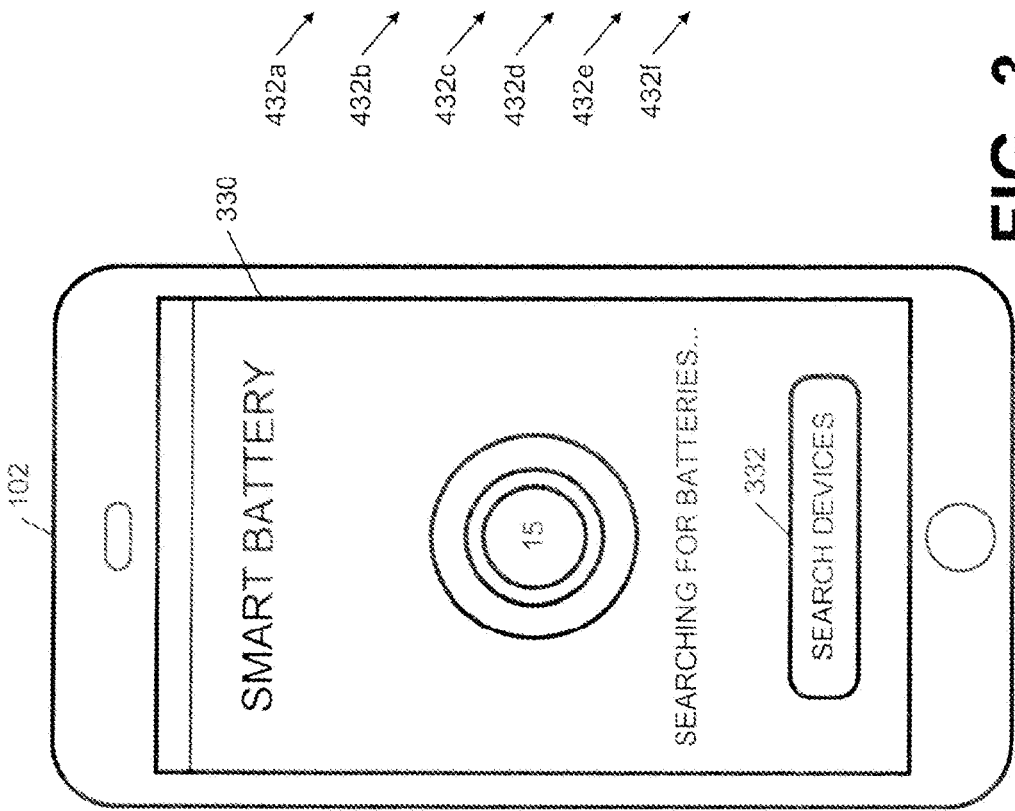
FIG. 3 depicts a user interface for searching for batteries and/or devices, according to embodiments disclosed herein.

FIG. 3 depicts a user interface 330 for searching for batteries and/or powered devices, according to embodiments disclosed herein. As illustrated, the user computing device 102 may provide the user interface 330 (and/or other user interfaces described herein). Specifically, the user interface 330 may be provided as part of a software application, such as those downloaded for a mobile telephone or other device. Once the software application is launched (which may be caused by a user input and/or detection of a readable battery or powered device), the user interface 330 may be provided for searching for batteries in the vicinity of the user computing device 102.

As discussed above, the battery 106 and/or the powered device 108 may include a wireless communication mechanism, such as an RFID tag, Wi-Fi transmitter, etc. Accordingly, the user computing device 102 may detect which batteries are within range of the user computing device 102. Similarly, some embodiments may be configured such that the batteries communicate with a device, such as a router or other bridging device that is communicatively coupled to a local network. This device may additionally communicate with the user computing device 102 to allow the user computing device 102 the ability to monitor the batteries and/or devices, even when the user computing device 102 is not within range to communicate directly with the batteries and/or other devices. Such embodiments may serve useful, such as if the user is shopping and cannot remember which batteries need replacing.

Also included in the user interface 330 is a user option, such as a search devices option 332. The search devices option 332 may activate a feature for the user computing device 102 to locate powered devices, instead of batteries. As described above, certain powered devices may be equipped with the ability to communicate battery characteristics with the user computing device 102.

Figure 4:
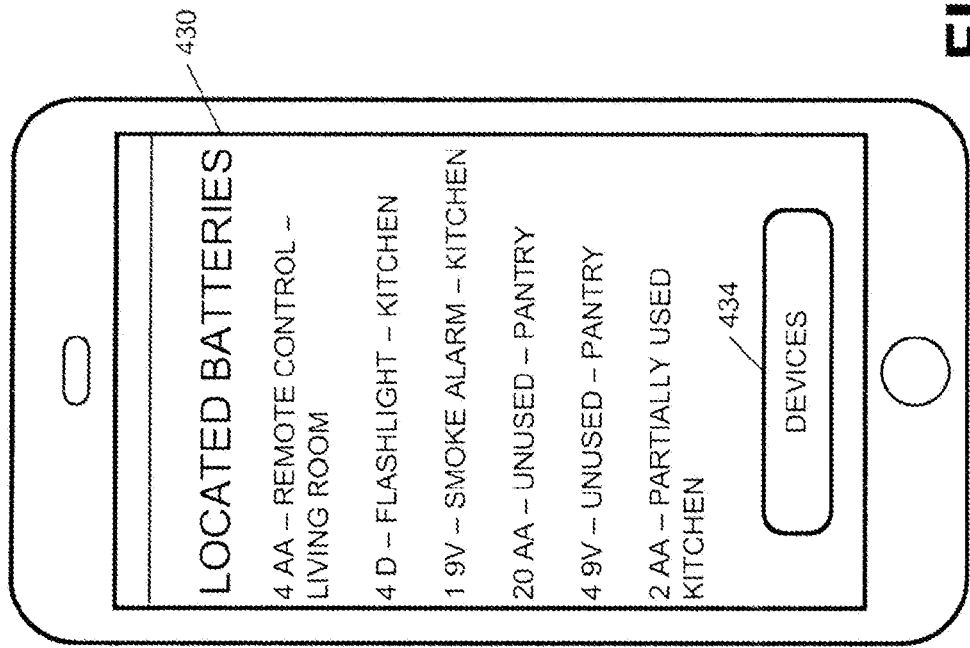
FIG. 4 depicts a user interface for providing a list of located batteries, according to embodiments disclosed herein.

FIG. 4 depicts a user interface 430 for providing located batteries, according to embodiments disclosed herein. In response to the user computing device 102 detecting one or more batteries, the user interface 430 may be provided. As illustrated, the user interface 430 may provide user options, such as battery options 432*a*-432*f* (collectively referred to as "battery options 432") of batteries that were located, as well as additional information about the batteries. Such additional information may include a battery type, a powered device type, a physical location, and/or other information. In response to selection of one or more of the battery options 432, additional details may be provided. Also included is a devices option 434. In response to selection of the devices option 434, listing of located powered devices may be provided.

Figure 5:
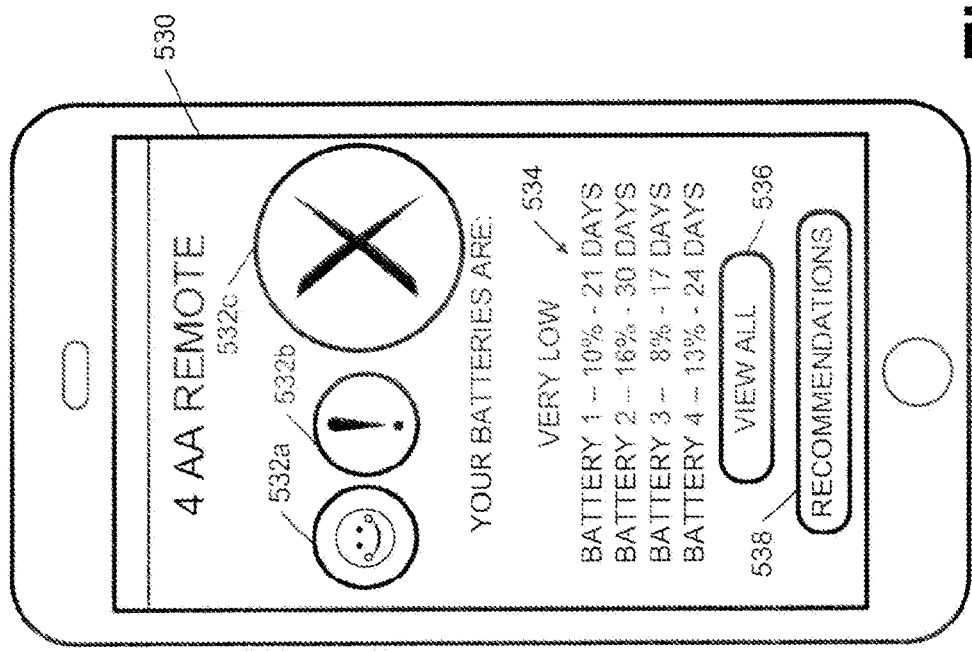
FIG. 5 depicts a user interface for providing battery level of batteries that power a device, according to embodiments disclosed herein.

FIG. 5 depicts a user interface 530 for providing battery level of batteries that power a device, according to embodiments disclosed herein. In response to selection of the battery option 432a from FIG. 4, the user interface 530 may be provided. Specifically, the user interface 530 includes battery condition indicators 532a, 532b, and 532c, which provide a graphical representation of whether the batteries in the remote control should be replaced. The battery condition indicator 532a signifies that a battery that is in good condition. The battery condition indicator 532b signifies that a battery is in a warning condition. The battery indicator 532c signifies that a battery is in a replacement condition. As an example, battery condition indicator 532a may represent a battery that has 100-67 charge remaining. The battery condition indicator 532b may represent a battery that has 67-33 charge remaining. The battery indicator 532c may represent a battery that has 33-0 charge remaining.

Also provided in the user interface 530 are individual battery statuses 534. Specifically, while a particular powered device (such as the remote control depicted in FIG. 5) may utilize a plurality of batteries. As such, all of those batteries may need to have a certain charge level to cause the powered device to operate. However, this does not necessarily mean that all of the batteries need to be replaced. Specifically, if one of the batteries is in poor condition with regard to the other batteries that power the powered device 108, the individual battery statuses 534 may provide this information.

Also included are a view all option 536 and a recommendations option 538. In response to selection of the view all option 536, information related to all of the batteries in the powered device may be provided. In response to selection of the recommendations option 538, recommendations for replacing the batteries may be provided.

Figure 6:
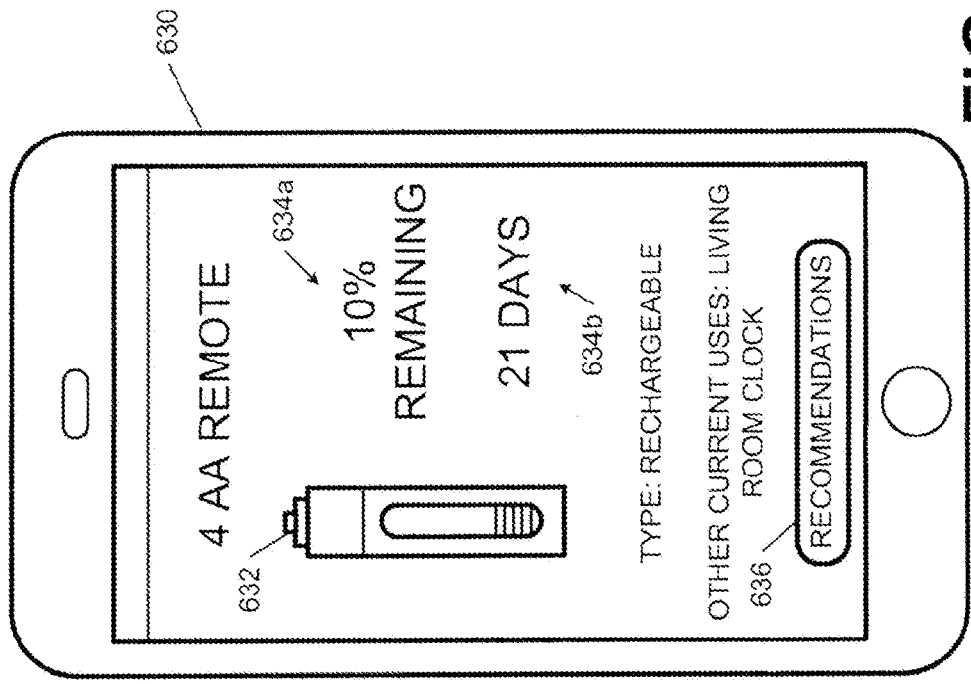
FIG. 6 depicts a user interface for providing a battery level for a particular battery that powers a device, according to embodiments disclosed herein.

FIG. 6 depicts a user interface 630 for providing a battery level for a particular battery that powers a powered device 108, according to embodiments disclosed herein. In response to selection of one of the individual battery statuses 534 from FIG. 5, the user interface 630 may be provided. As illustrated, the user interface 630 includes a graphical representation 632 that includes the battery and a representation of a battery characteristic. Also included are a textual remaining charge indicator 634a, and a time until replacement indicator 634b. The user interface 630 may also identify a battery type, as well as another use for the battery in its current condition. Identifying battery type may be utilized to determine authenticated and/or counterfeited branded batteries to determine the authenticity of a battery that is placed in use. Additionally, the identification may be utilized for monitor and crediting a user's proper maintenance of batteries. As an example, the identifier may be coupled with logic described herein to indicate when (and/or where) a battery should be recycled. The consumer recycling habits may be recorded and the user may be provided with coupons, credits, or other incentives for recycling.

Specifically, if the battery is currently being used in a powered device that consumes large amounts of power (such as a camera); the battery may be considered depleted. However, the battery may be capable for use in a different powered device that consumes less power (such as a clock). Accordingly, the user computing device 102 may determine battery usage of the detected powered devices and may recommend an alternative use for the battery. If no alternative use is available, the user computing device 102 may recommend discarding or recharging the battery. Accordingly, a recommendations option 636 is also provided in FIG. 6. In response to selection of the recommendations option 636, other recommendations for the battery may be provided.

It should be understood that the user computing device 102 may be configured to determine a depletion rate of one or more of the batteries. As an example, some embodiments may be configured such that the powered device 108 and/or the battery 106 are configured to determine the depletion rate and send this information to the user computing device 102. As another example, some embodiments may be configured such that the powered device 108 is configured to communicate the device type to the user computing device 102. The user computing device 102 may use the device type in combination with a discharge model stored within the memory of the user computing device 102 to determine the depletion rate. As another example, some embodiments may be configured such that the user computing device 102 includes a device lookup table within its memory. The user may select the powered device 108 from the lookup table and input the selected device into the user computing device 102. The user computing device 102 may use the device type that the user inputs in combination with a discharge model stored within the memory of the user computing device 102 to determine the depletion rate. As another example, the user computing device 102 may include image recognition capabilities. The user may take a picture of the powered device 108 with the user computing device 102. The user computing device 102 may use the device type in combination with a discharge model stored within the memory of the user computing device 102 to determine the depletion rate. Similarly, some embodiments are configured such that the battery (and/or powered device) merely sends the user computing device 102 a first wireless signal that identifies a current charge level. The battery (and/or powered device) may send a second wireless signal at a second time that identifies a charge level at that time. From this information, the user computing device 102 may determine a depletion rate of the battery 106. Additionally, the user computing device 102 may identify an external condition that affects the battery characteristic of the battery 106. As an example, temperature, humidity, and/or other factors may affect depletion rate and/or other characteristics of the battery. Accordingly, the user computing device 102 may account for one or more of these external conditions determine the current depletion rate of the battery. The depletion rate may also be displayed graphically by the user computing device 102. For example, an x-y graph of voltage versus time may be displayed by the user computing device 102 to indicate to the consumer the depletion rate of the battery 106 and/or the battery 110 within the powered device 108.

Figure 7:
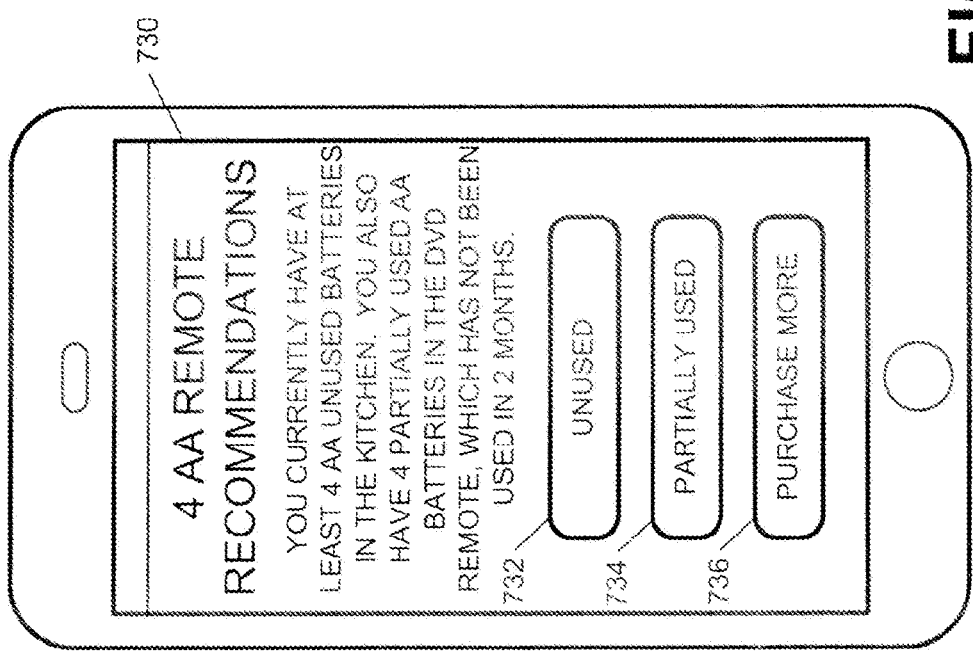
FIG. 7 depicts a user interface for recommending a battery replacement strategy, according to embodiments disclosed herein.

FIG. 7 depicts a user interface 730 for recommending a battery replacement strategy, according to embodiments disclosed herein. In response to selection of the recommendations option 538 from FIG. 5 and/or the recommendations option 636 from FIG. 6, the user interface 730 may be provided. As illustrated, the user interface 730 includes a physical location of batteries that may be utilized as a replacement battery. Specifically, the user computing device 102 may determine whether a partially used or unused battery (or other unused energy storage device) is available and within a predetermined range (such as in the user's house). As indicated, the batteries may be currently unused batteries, partially used batteries that are not currently in use and/or partially used batteries that are currently in use (such as those that are depleted for their current powered device). Additionally, the user interface 730 includes an unused option 732, a partially used option 734, and a purchase option 736.

In response to selection of the unused option 732, the user is indicating to the user computing device 102 that the replacement batteries will be the unused batteries recommended in the user interface 730. Selection of the partially used option 734 indicates that the partially used batteries will be used. Selection of the purchase option 736 opens another user interface and/or otherwise facilitates purchase of (or directs the user of where to purchase) replacement batteries.

Specifically, some embodiments may be configured to make a prediction regarding an expected time that a battery may deplete to a predetermined charge level. The user computing device 102 may additionally determine whether this predicted time falls within a predetermined timeframe (e.g., such as within two days). Accordingly, embodiments may be configured to, in response to determining that the expected time falls within the predetermined timeframe, facilitate a purchase, for example online or in-store, of a replacement battery. The user computing device 102 may include global positioning system (GPS) capability to direct the consumer to the nearest retail outlet to purchase the replacement battery. The user computing device 102 may connect to an inventory and/or cost database of the retail outlets to enable the user to make an informed decision as to which retail outlet to purchase the replacement battery. The user computing device 102 may also recommend a method of disposal or a method of recycling a depleted battery.

Similarly, some embodiments may be configured to determine whether a battery has entered a retail establishment. If so, the user computing device 102 may be provided with a coupon or discount for replacing that battery (such as during that visit). Additional discounts and/or digital marketing may be provided to the user, based on pick lists, guiding questions, user profile information, and/or other information about the user.

Figure 8:
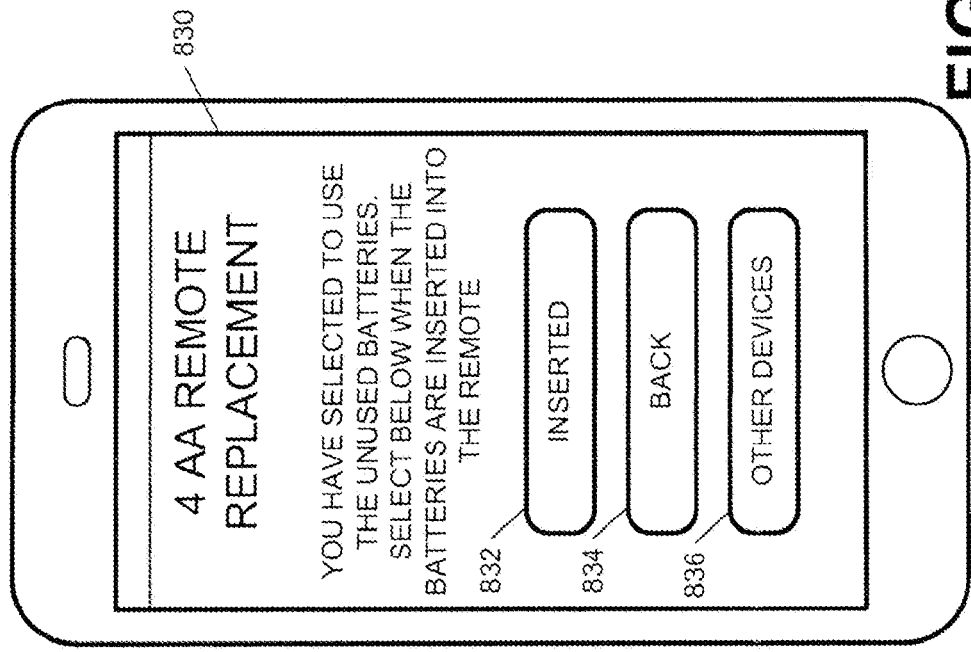
FIG. 8 depicts a user interface for identifying that replacement batteries have been inserted into a device, according to embodiments disclosed herein.

FIG. 8 depicts a user interface 830 for identifying that replacement batteries have been inserted into a device, according to embodiments disclosed herein. In response to selection of the unused option 732 from FIG. 7, the user interface 830 may be provided. As illustrated, the user interface 830 includes a statement of the selected batteries, as well as an inserted option 832, a back option 834, and a devices option 836. Once the user has inserted the replacement batteries into the powered device, the user may select the inserted option 832, so the user computing device 102 may begin acquiring data regarding this new use. Selection of the back option 834 returns the user to the user interface 730 from FIG. 7 to reselect the batteries that will be used. Selection of the devices option 836 allows the user to view other detected powered devices. It will be understood that while the user may manually provide the user input discussed with regard to FIGS. 7 and 8, this is merely an example. Specifically, some embodiments may be configured to automatically detect the batteries that are inserted into a powered device. In such embodiments, the user need not select the batteries that will be inserted or indicate when the batteries are inserted into the powered device.

Figure 9:
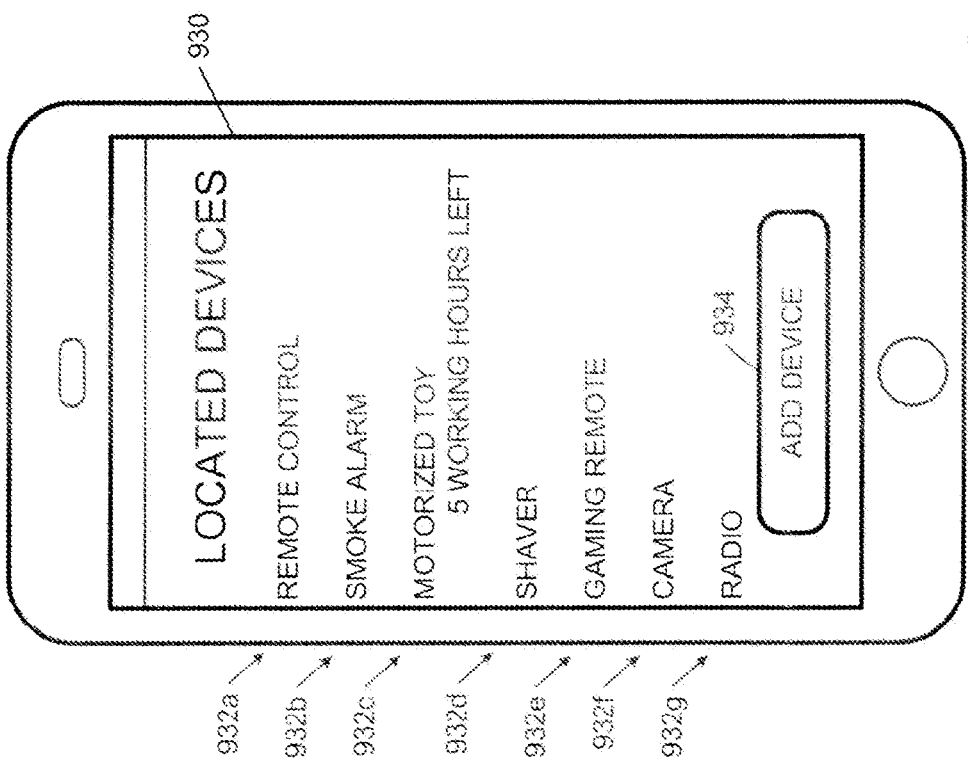
FIG. 9 depicts a user interface for providing a list of located battery-operated devices, according to embodiments disclosed herein.

FIG. 9 depicts a user interface 930 for providing located battery-operated devices, according to embodiments disclosed herein. In response to selection of the search devices option 332 from FIG. 3 and/or the devices option 434 from FIG. 4, the user interface 930 may be provided. As discussed above, the user computing device 102 may search for batteries and/or powered devices. Accordingly the user interface 930 may provide device options 932a-932g. In response to selection of one of the device options 932a-932g, additional information regarding the powered device and/or the batteries that power the powered device may be provided. As an example, the user computing device 102 may predict a time frame for the battery to deplete to a predetermined charge level. This information may be provided in the user interface 930. Also included in the user interface 930 is an add device option 934. The add device option 934 provides the user with the ability to manually add a device that may have otherwise not been detected, as described in more detail below. The user computing device 102 may include image recognition capabilities. The user may take a picture of the powered device with the user computing device 102. The picture, or other image, of the powered device may be associated with the powered device. The picture, or other image, of the powered device may be provided in the user interface 930.

Figure 10:
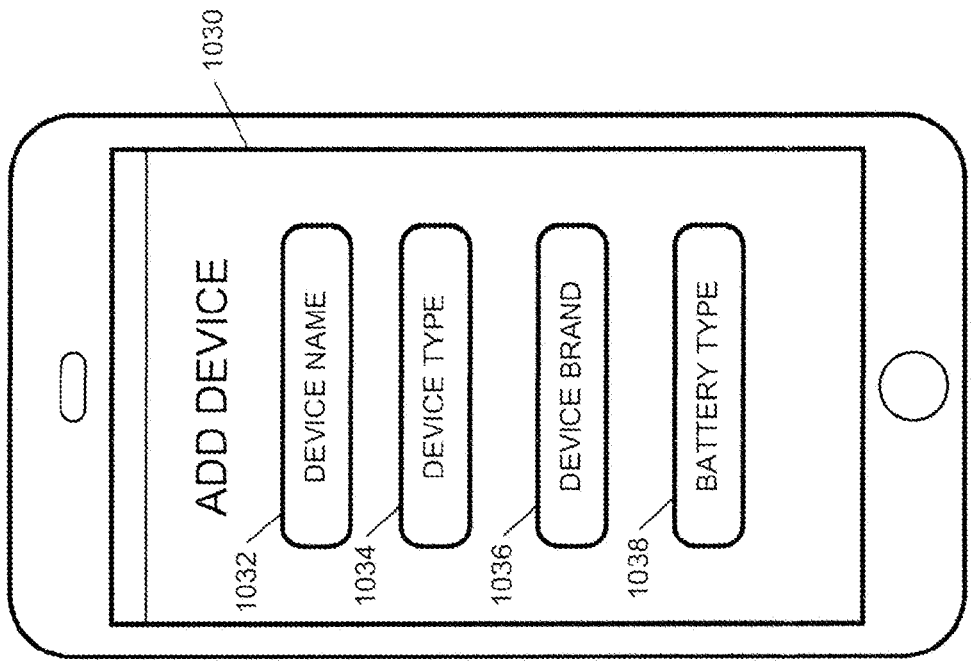
FIG. 10 depicts a user interface for adding a device for monitoring, according to embodiments disclosed herein.

FIG. 10 depicts a user interface 1030 for adding a device for monitoring, according to embodiments disclosed herein. In response to selection of the add device option 934 from FIG. 9, the user interface 1030 may be provided. As illustrated, the user interface 1030 may include a device name option 1032, a device type option 1034, a device brand option 1036, and a battery type option 1038. In response to selection of the device name option 1032, the user may input a device name for the new device. In response to selection of the device type option 1034, the user may input a device type. In response to selection of the device brand option 1036 the user may input a brand of the device, a model number, and/or other similar data. In response to selection of the battery type option 1038, the user may input the size of the battery that the powered device receives and/or other similar data. The user computing device 102 may include image recognition capabilities. The user may take a picture of the device with the user computing device 102. The picture, or other image, of the device may be associated with the powered device. The picture, or other image, of the powered device may be provided in the user interface 1030.

Figure 11:
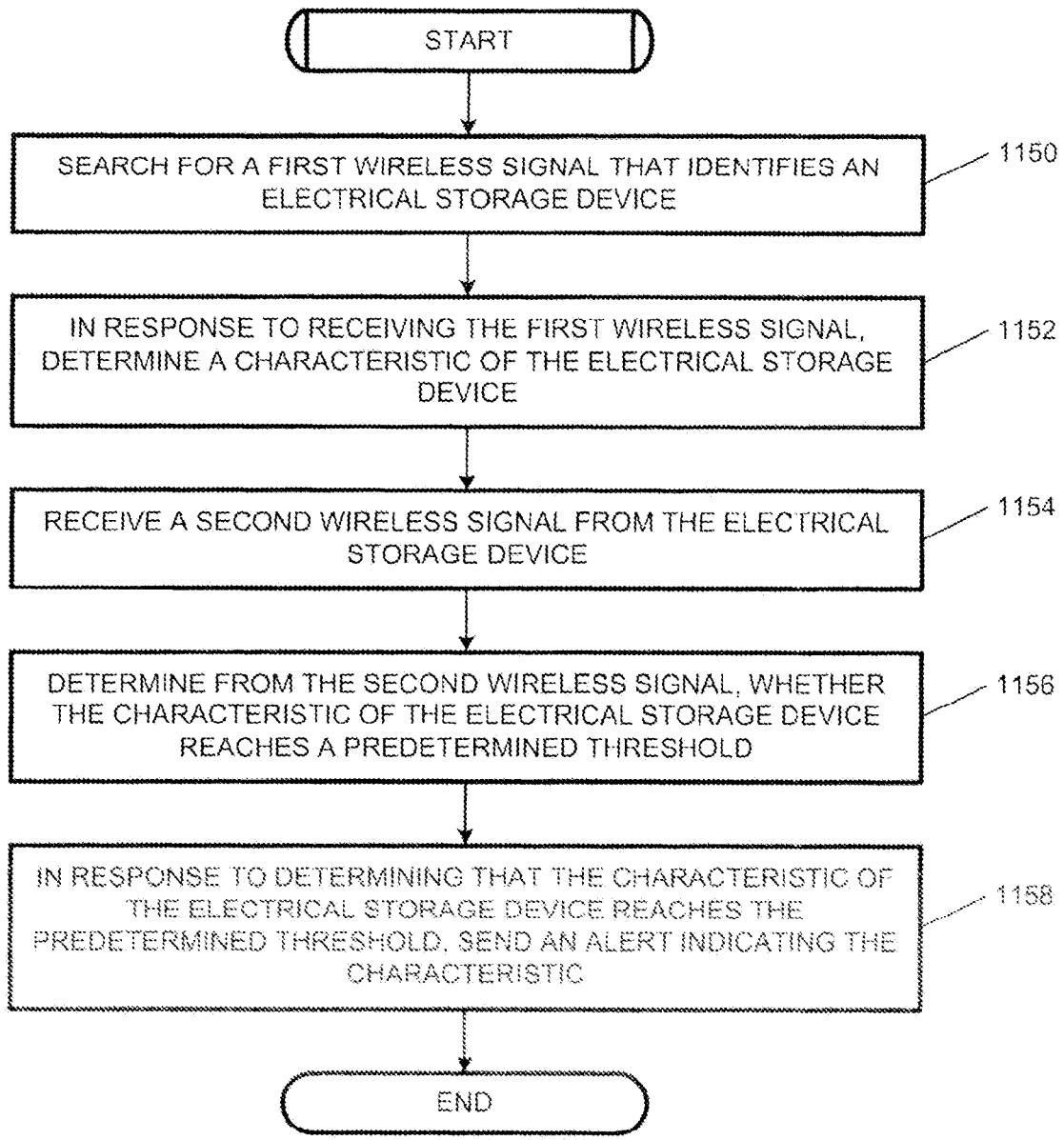
FIG. 11 depicts a flowchart illustrating a process that may be utilized for remotely determining a battery characteristic.

FIG. 11 depicts a flowchart illustrating a process that may be utilized for remotely determining a battery characteristic. As illustrated in block 1150, a search may be performed for a first wireless signal (an incoming wireless signal) that identifies an energy storage device. In block 1152, in response to receiving the first wireless signal, a characteristic of the energy storage device may be determined. In block 1154, a second wireless signal may be received from the energy storage device. In block 1156, a determination may be made, from the second electrical signal, whether the characteristic of the energy storage device reaches a predetermined threshold. This determination may include determining whether the battery charge is depleted beyond a predetermined threshold. Other examples include scenarios where the impedance changes beyond a predetermined threshold, whether battery charge depletes at a rate beyond a predetermined threshold, etc. In block 1158, in response to determining that the characteristic of the energy storage device reaches the predetermined threshold, an alert may be sent indicating the characteristic.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A computing device for remotely monitoring battery activity comprising:
    a processor; and
    a non-transitory memory component that stores logic that, when executed by the processor, causes the computing device to perform at least the following:
        obtain an image corresponding to a powered device powered by a battery;
        analyze the image to identify a powered device type;
        obtain a discharge model corresponding to the powered device type;
        based on the discharge model, determine a depletion rate for the battery;
        based on the depletion rate, predict a remaining charge in the battery;
        determine that the remaining charge is depleted below a threshold charge level; and
        in response to determining that the remaining charge level of the battery is depleted below the threshold charge level, generate an alert indicating that the remaining charge level is depleted below the threshold charge level.

2. The computing device of claim 1, wherein the logic further causes the computing device to receive a communication signal that indicates a current charge level of the battery.

3. The computing device of claim 2, wherein the logic further causes the computing device to adjust the depletion rate based on the current charge level for the battery.

4. The computing device of claim 1, wherein the logic further causes the computing device to identify an external condition that affects the depletion rate of the battery.

5. The computing device of claim 4, wherein the logic further causes the computing device to adjust the depletion rate based on the external condition.

6. The computing device of claim 1, wherein the logic further causes the computing device to determine that an unused or partially used battery is within a signal range of the computing device.

7. The computing device of claim 6, wherein the logic further causes the computing device to configure the alert to include an indication of a physical location of the unused or partially used battery.

8. The computing device of claim 6, wherein:
    two or more unused or partially used batteries are within the signal range of the computing device; and
    the logic further causes the computing device to present an interface to enable a user to select a replacement battery from among the two or more unused or partially used batteries.

9. A method for remotely monitoring activity of an energy storage device, comprising:
    obtaining, by a computing device, an image corresponding to a powered device powered by a battery;
    analyzing, by the computing device, the image to identify a powered device type;
    obtaining, by the computing device, a discharge model corresponding to the powered device type;
    based on the discharge model, determining, by the computing device, a depletion rate for the battery;
    based on the depletion rate, predicting, by the computing device, a remaining charge in the battery;
    determining, by the computing device, that the remaining charge is depleted below a threshold charge level; and
    in response to determining that the remaining charge level of the battery is depleted below the threshold charge level, generating, by the computing device, an alert indicating that the remaining charge level is depleted below the threshold charge level.

10. The method of claim 9, further comprising:
receiving a communication signal that indicates a current charge level of the battery.

11. The method of claim 10, further comprising:
adjusting, by the computing device, the depletion rate based on the current charge level for the battery.

12. The method of claim 9, further comprising:
identifying, by the computing device, an external condition that affects the depletion rate of the battery.

13. The method of claim 12, further comprising:
adjusting, by the computing device, the depletion rate based on the external condition.

14. The method of claim 9, further comprising:
determining, by the computing device, that an unused or partially used battery is within a signal range of the computing device.

15. The method of claim 14, further comprising:
configuring, by the computing device, the alert to include an indication of a physical location of the unused or partially used battery.

16. The method of claim 14, wherein:
    two or more unused or partially used batteries are within the signal range of the computing device; and
    the method further comprises presenting, by the computing device, an interface to enable a user to select a replacement battery from among the two or more unused or partially used batteries.

17. A non-transitory computer-readable medium for remotely monitoring activity of an energy storage device powering a powered device that stores logic that, when executed by a processor, causes a computing device to perform the following:
    obtain an image corresponding to the powered device;
    analyze the image to identify a type for the powered device;
    obtain a discharge model corresponding to the powered device type;

based on the discharge model, determine a depletion rate for the energy storage device;

based on the depletion rate, predict a remaining charge in the energy storage device;

determine that the remaining charge is depleted below a threshold charge level; and in response to determining that the remaining charge level of the energy storage device is depleted below the threshold charge level, generate an alert indicating that the remaining charge level is depleted below the threshold charge level.

18. The non-transitory computer-readable medium of claim 17, wherein the logic further causes the computing device to determine that an unused or partially used energy storage device is within a signal range of the computing device.

19. The non-transitory computer-readable medium of claim 18, wherein the logic further causes the computing device to configure the alert to include an indication of a physical location of the unused or partially used energy storage device.

20. The non-transitory computer-readable medium of claim 18, wherein:

two or more unused or partially used energy storage devices are within the signal range of the computing device; and the logic further causes the computing device to present an interface to enable a user to select a replacement energy storage device from among the two or more unused or partially used energy storage devices.

* * * * *